(12) United States Patent
Yuh

(10) Patent No.: US 8,374,031 B2
(45) Date of Patent: Feb. 12, 2013

(54) TECHNIQUES FOR THE FAST SETTLING OF WORD LINES IN NAND FLASH MEMORY

(75) Inventor: Jong Hak Yuh, Pleasanton, CA (US)

(73) Assignee: SanDisk Technologies, Inc., Plano, TX (US)

(*) Notice: Subject to any disclaimer, the term of this patent is extended or adjusted under 35 U.S.C. 154(b) by 106 days.

(21) Appl. No.: 12/893,611

(22) Filed: Sep. 29, 2010

(65) Prior Publication Data

US 2012/0075931 A1 Mar. 29, 2012

(51) Int. Cl.
*G11C 16/04* (2006.01)

(52) U.S. Cl. .......... 365/185.17; 365/185.22; 365/185.28

(58) Field of Classification Search ............ 365/185.17, 365/185.22, 185.28
See application file for complete search history.

(56) References Cited

U.S. PATENT DOCUMENTS

| | | | |
|---|---|---|---|
| 5,070,032 A | 12/1991 | Yuan et al. |
| 5,095,344 A | 3/1992 | Harari et al. |
| 5,172,338 A | 12/1992 | Mehrotra et al. |
| 5,218,569 A | 6/1993 | Banks |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 5,920,507 A | 7/1999 | Takeuchi et al. |
| 6,011,725 A | 1/2000 | Eitan |

(Continued)

FOREIGN PATENT DOCUMENTS

| | | |
|---|---|---|
| EP | 0 856 850 A2 | 8/1998 |
| JP | 2000-040382 A | 2/2000 |

(Continued)

OTHER PUBLICATIONS

Notification of Transmittal of the International Search Report and the Written Opinion of the International Searching Authority, or the Declaration for International Application No. PCT/US2011/048854 mailed Nov. 3, 2011, 12 pages.

(Continued)

*Primary Examiner* — Pho M Luu
(74) *Attorney, Agent, or Firm* — Davis Wright Tremaine LLP

(57) ABSTRACT

In non-volatile memory devices, a write operation typically consists of an alternating set of pulse and verify operations. After a pulse is applied, the device must be biased properly for an accurate verify, with a selected word-line settled at the desired voltage level. The techniques described here address the problem of a relatively large waiting time at the start of a verify phase of a write operation when the selected word line is moving to its first verify level, while at the same time the non-selected word lines of a NAND type array are ramping up to a read pass level. For the non-selected word lines, during the program pulse, these are set at a first voltage above ground and then, during the verify operation, then are set at the read pass level. Rather than take the non-selected word lines to ground in between, they are instead moved directly from their voltage in the pulse phase directly into their read pass level. This helps to reduce the amount of movement in the selected word line due to capacitive coupling, allowing the preparation of the verify level of a selected word line settings earlier.

9 Claims, 13 Drawing Sheets

U.S. PATENT DOCUMENTS

| | | | |
|---|---|---|---|
| 6,028,792 | A | 2/2000 | Tanaka et al. |
| 6,046,935 | A | 4/2000 | Takeuchi et al. |
| 6,185,134 | B1 | 2/2001 | Tanaka |
| 6,222,762 | B1 | 4/2001 | Guterman et al. |
| 6,243,290 | B1 | 6/2001 | Kurata et al. |
| 6,324,121 | B2 | 11/2001 | Banks |
| 6,327,189 | B2 | 12/2001 | Banks |
| 6,339,545 | B2 | 1/2002 | Banks |
| 6,343,034 | B2 | 1/2002 | Banks |
| 6,344,998 | B2 | 2/2002 | Banks |
| 6,404,675 | B2 | 6/2002 | Banks |
| 6,522,580 | B2 | 2/2003 | Chen et al. |
| 6,538,922 | B1 | 3/2003 | Khalid et al. |
| 6,745,286 | B2 | 6/2004 | Priester et al. |
| 6,785,164 | B2 | 8/2004 | Gonzalez et al. |
| 7,161,842 | B2 * | 1/2007 | Park ............... 365/185.33 |
| 7,243,275 | B2 | 7/2007 | Gongwer et al. |
| 7,408,818 | B2 * | 8/2008 | Yoshinaga et al. ....... 365/189.09 |
| 7,434,111 | B2 | 10/2008 | Sugiura et al. |
| 7,457,162 | B2 | 11/2008 | Guterman et al. |
| 7,539,055 | B2 * | 5/2009 | Enda et al. ............ 365/185.18 |
| 7,619,930 | B2 | 11/2009 | Mokhlesi |
| 7,652,948 | B2 * | 1/2010 | Lee et al. ............ 365/230.08 |
| 7,787,299 | B2 * | 8/2010 | Won et al. ............ 365/185.11 |
| 7,804,712 | B2 * | 9/2010 | Kim et al. ............ 365/185.03 |
| 2001/0040824 | A1 | 11/2001 | Banks |
| 2002/0156975 | A1 | 10/2002 | Staub et al. |
| 2006/0140007 | A1 | 6/2006 | Cernea et al. |
| 2007/0025157 | A1 | 2/2007 | Wan et al. |
| 2007/0153594 | A1 | 7/2007 | Chen |
| 2007/0263450 | A1 | 11/2007 | Cernea et al. |
| 2007/0291543 | A1 | 12/2007 | Mokhlesi |
| 2008/0127104 | A1 | 5/2008 | Li et al. |
| 2008/0198662 | A1 | 8/2008 | Mokhlesi |
| 2009/0097325 | A1 | 4/2009 | Won et al. |
| 2010/0027332 | A1 | 2/2010 | Lee et al. |

FOREIGN PATENT DOCUMENTS

| | | | |
|---|---|---|---|
| JP | | 2001-167589 A | 6/2001 |
| TW | | 490671 | 6/2002 |
| WO | WO 2004/053882 | A1 | 6/2004 |
| WO | WO 2008/103586 | A1 | 8/2008 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

TECHNIQUES FOR THE FAST SETTLING OF WORD LINES IN NAND FLASH MEMORY

FIELD OF THE INVENTION

This invention relates generally to semiconductor memory circuits such as electrically erasable programmable read-only memory (EEPROM) and flash EEPROM, and specifically to techniques for the writing of data to such devices.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling). Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

There is an ongoing effort to increase the performance of such memories. The programming of data into non-volatile memories is one of the more time consuming operations. A write operation typically consisted of an alternating series of programming operations, where selected memory cells receive a high-voltage programming pulse, and verify operations, where the pulsed cells are individually checked to determined whether or not they have reached their target data state. Consequently, there is a need to increase the speed and efficient of write operations, whether for the pulse or verify phase.

SUMMARY OF INVENTION

According to a general aspect of the invention, a method of writing one or more memory cells along a selected word line of a non-volatile memory having a NAND-type architecture. The method includes a series of one or more pulse-verify cycles, where a pulse-verify cycle includes applying a programming pass voltage greater than ground to non-selected word lines of a NAND string to which the selected word line belongs and, while applying the programming pass voltage to non-selected word lines, applying a programming pulse to the selected word line. Subsequent to applying the programming pulse, a read pass voltage greater than ground is applied to the non-selected word lines, where the voltage applied to the non-selected word lines is changed directly from the programming pass voltage to the read pass voltage without being set to ground in between. Subsequently, the selected word line is set to a first verify voltage greater than ground while applying the read pass voltage to the non-selected word lines.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Memory System

FIG. 1 to FIG. 11 illustrate example memory systems in which the various aspects of the present invention may be implemented.

Figure 1:
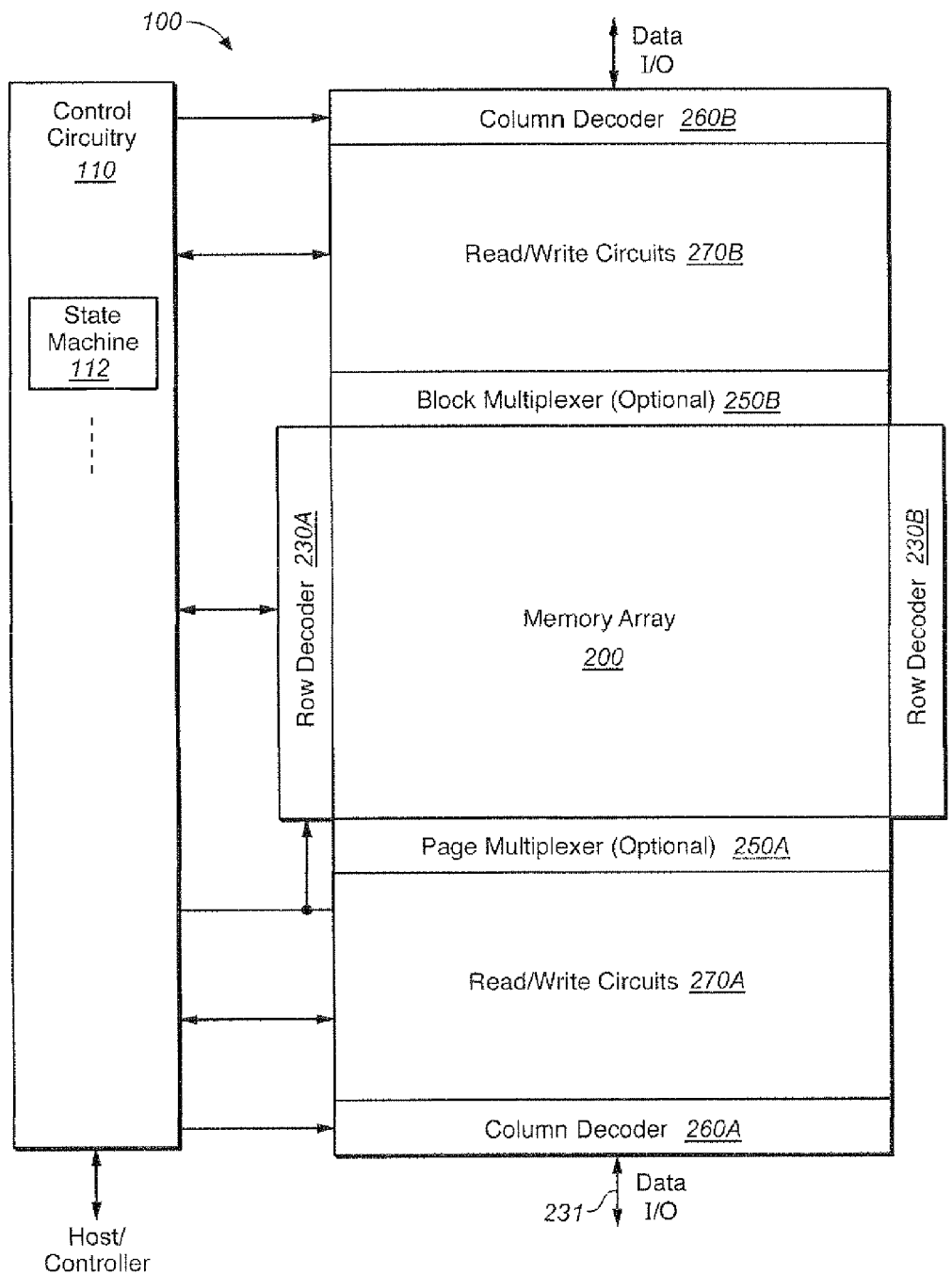
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
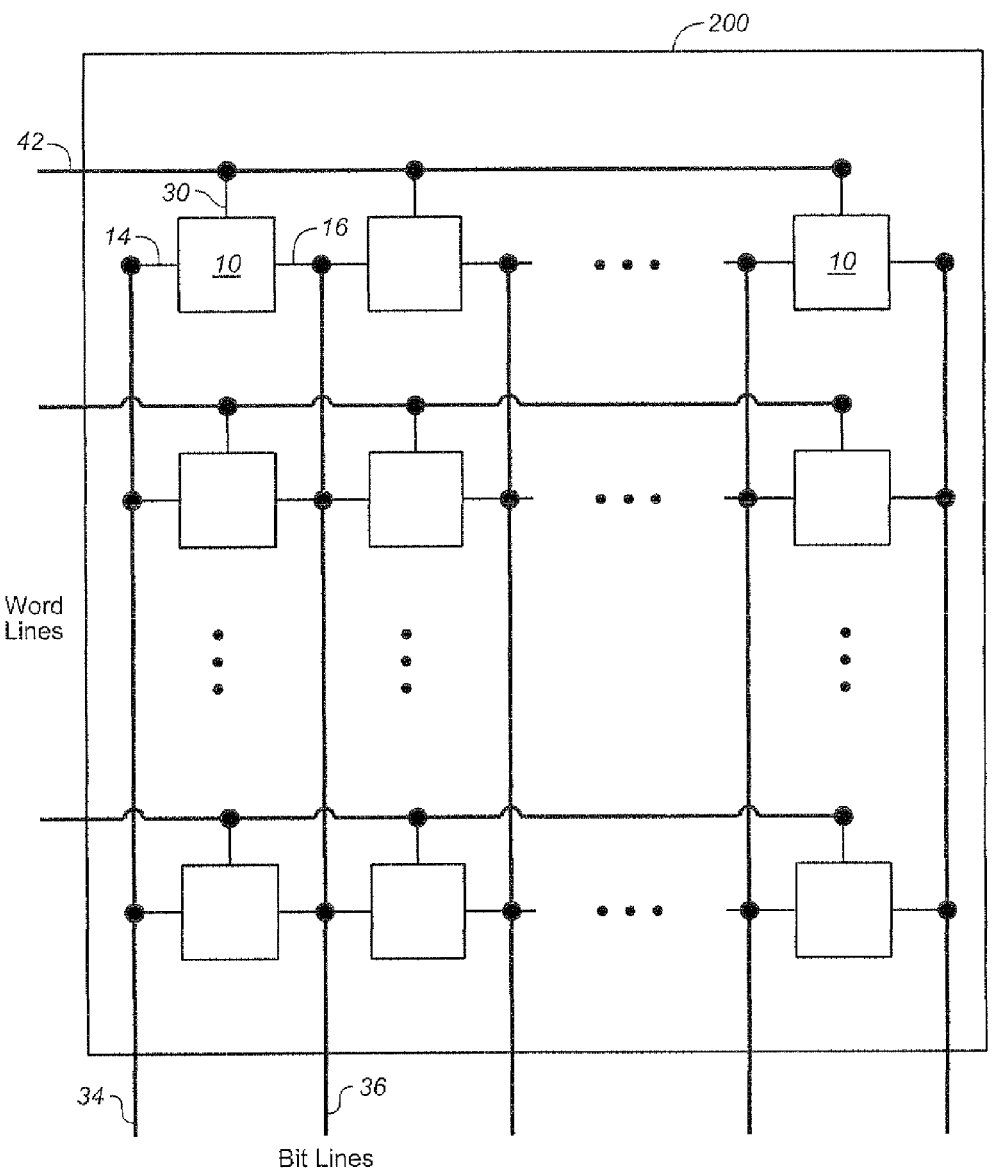
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
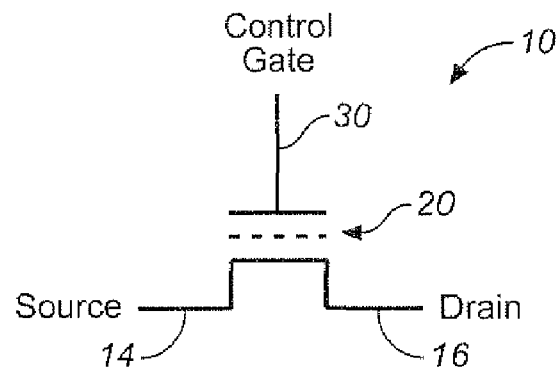
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
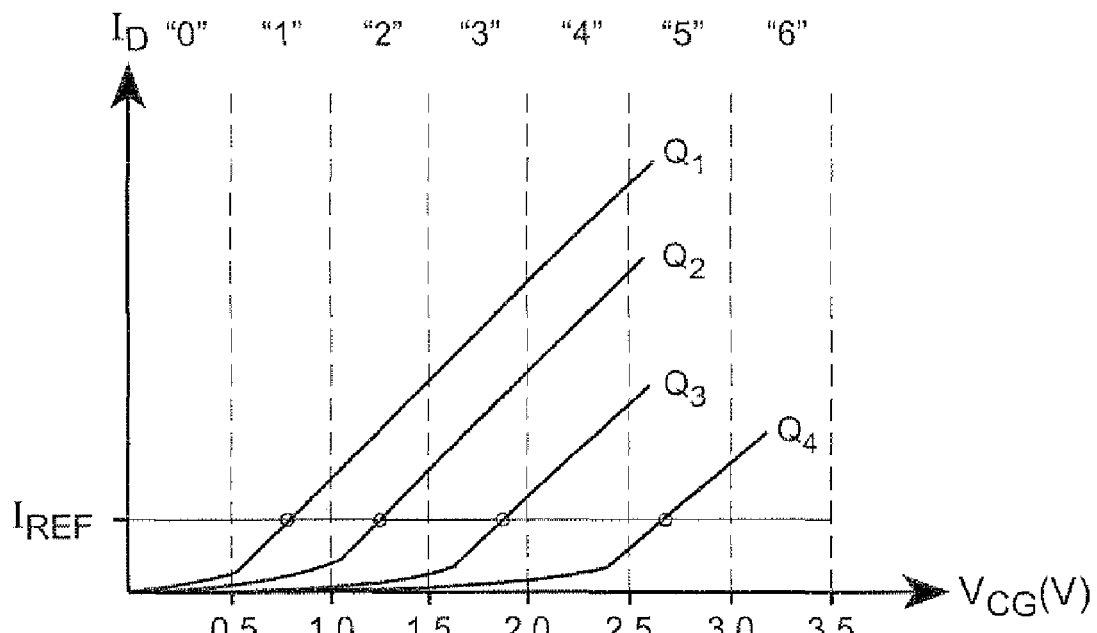
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
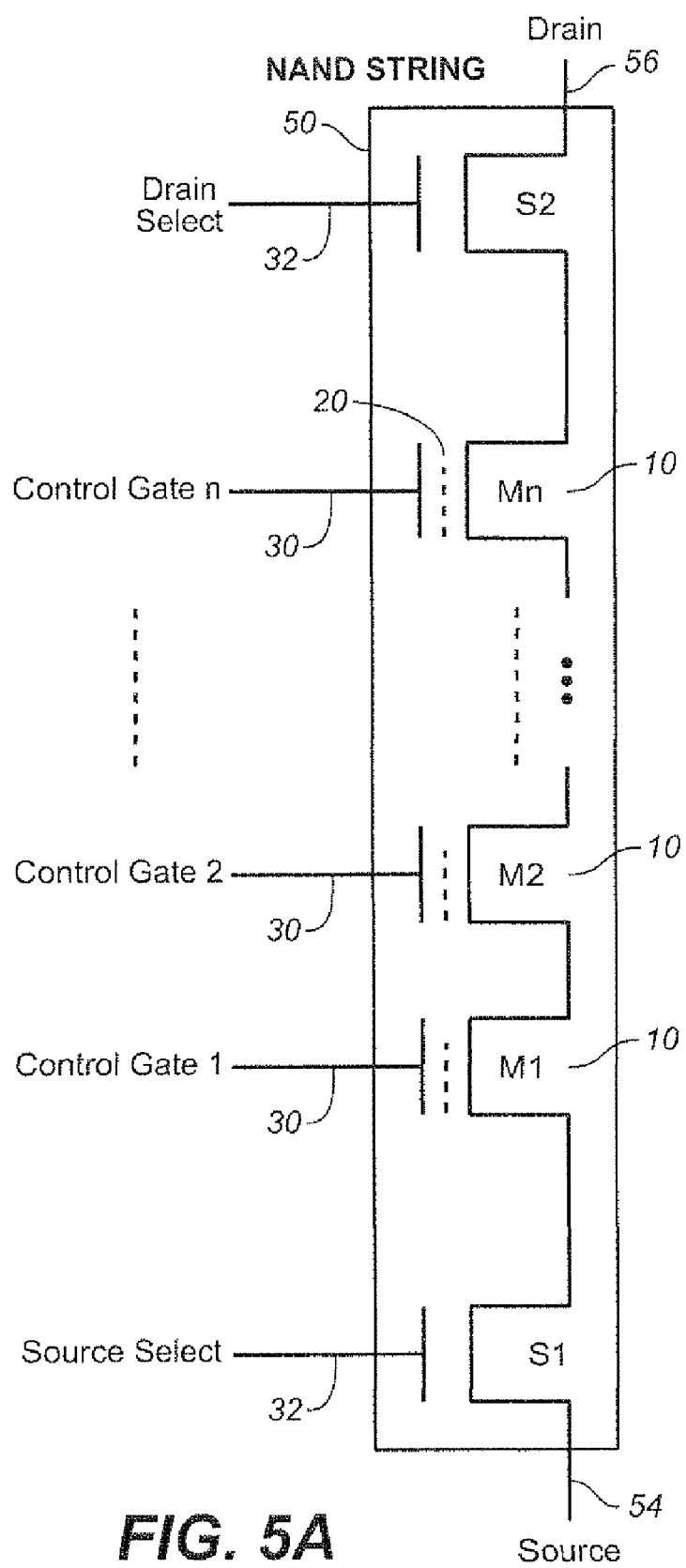
FIG. 5A illustrates schematically a string of memory cells organized into an NAND string.

FIG. 5A illustrates schematically a string of memory cells organized into an NAND string. An NAND string 50 comprises of a series of memory transistors M1, M2, ..., Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
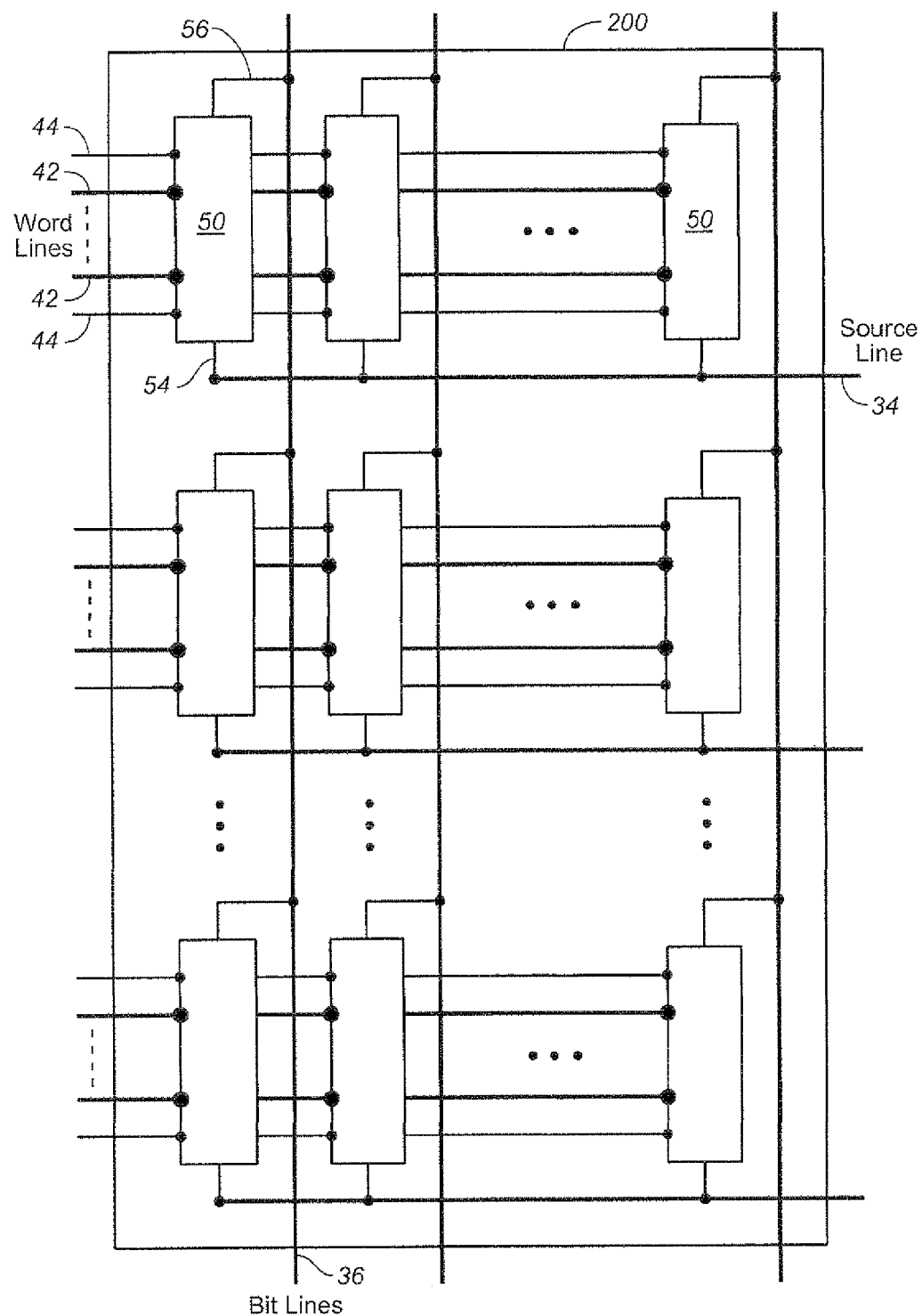
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
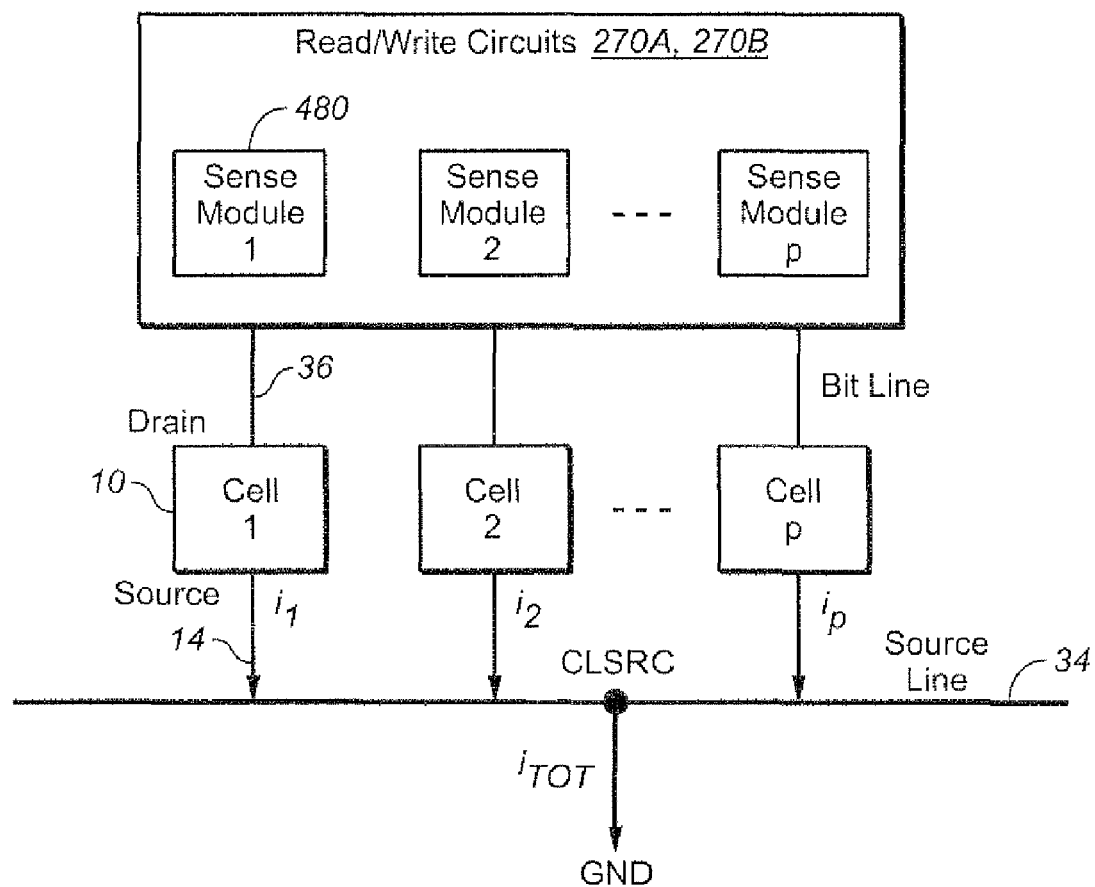
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, sense module p will sense a current $I_1$, in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
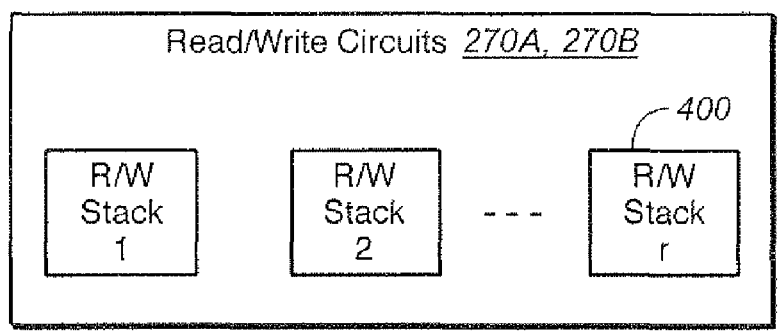
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
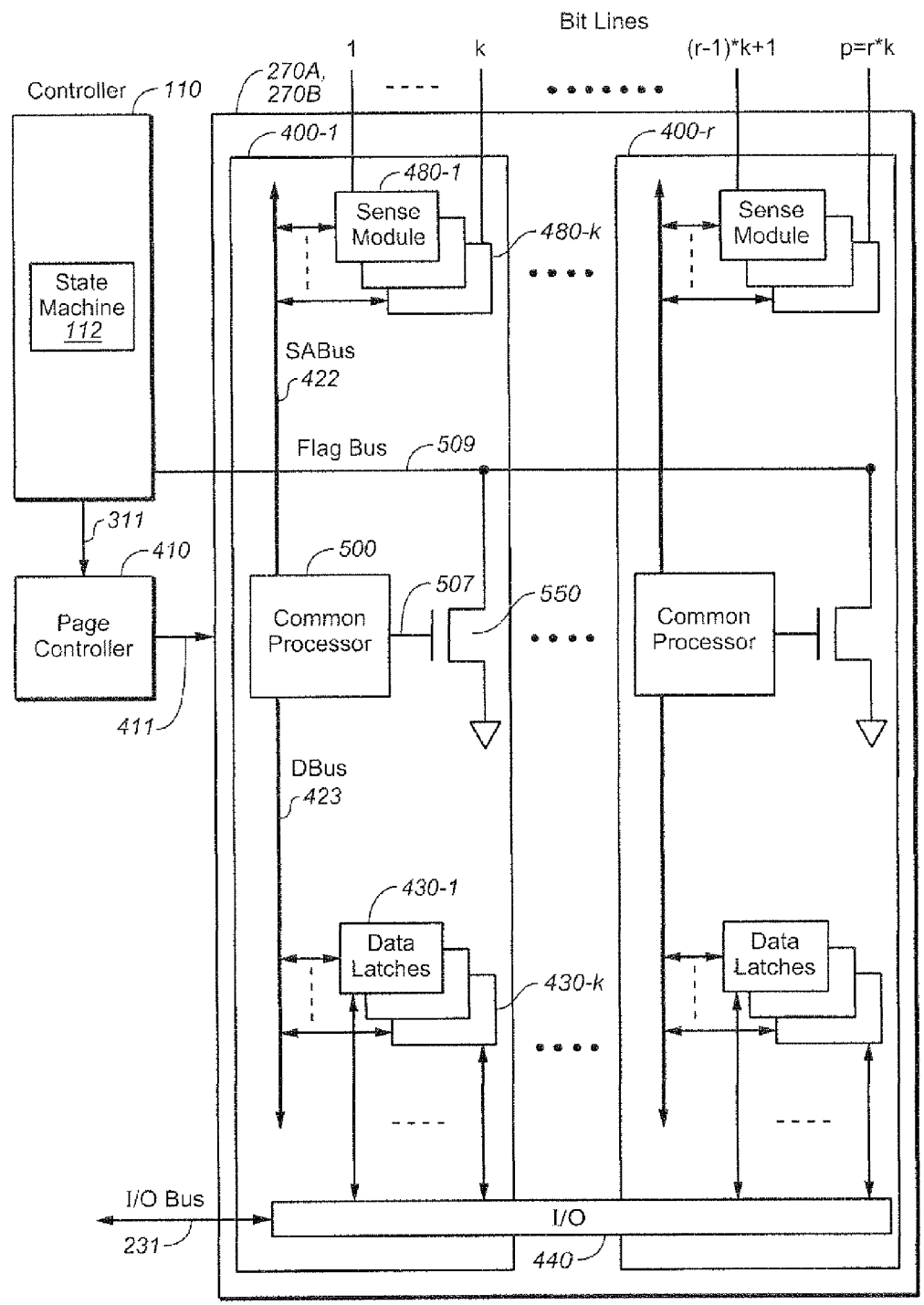
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably pre-charged by the controller 310 and will be pulled down when a status signal is asserted by any of the read/write stacks.

Examples Of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
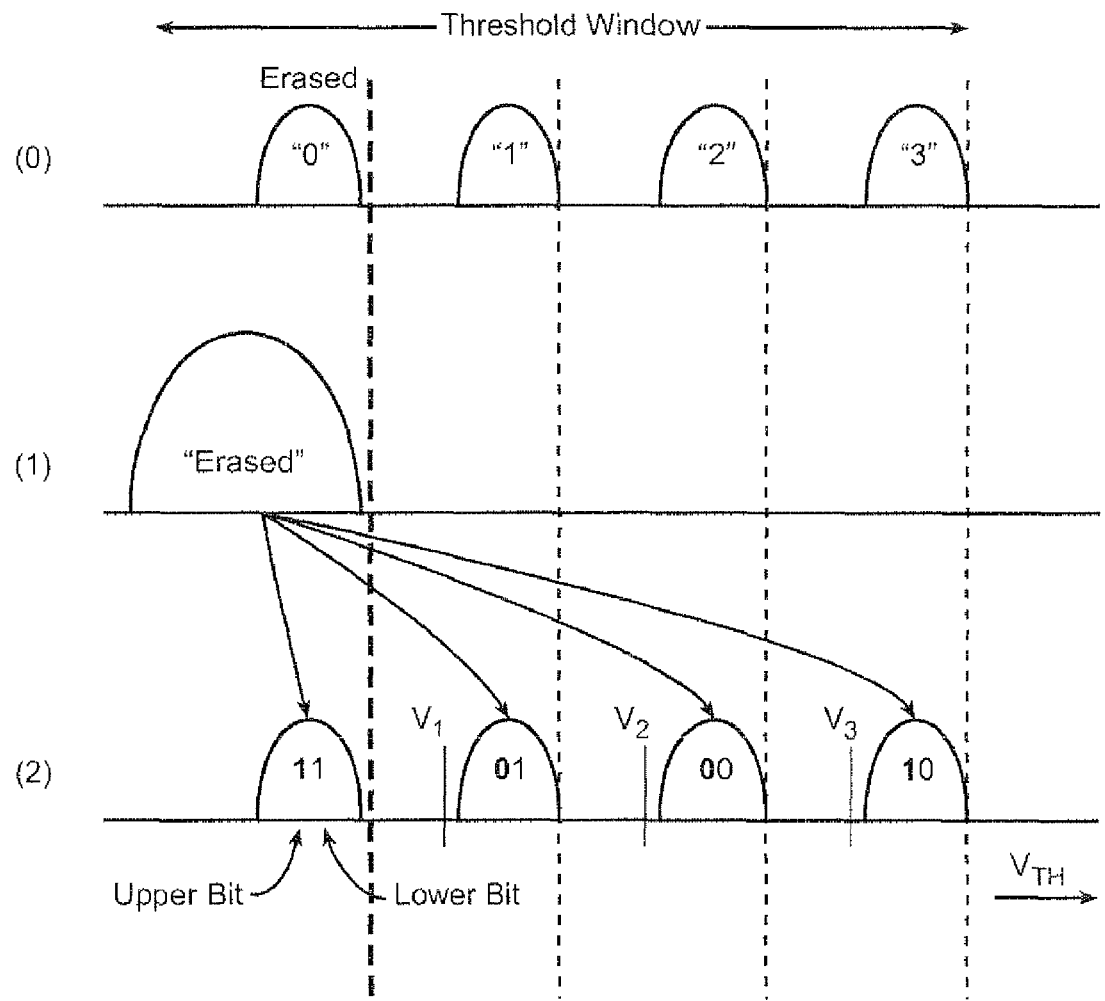
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $V_1$, $V_2$ and $V_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $V_1$, $V_2$ and $V_3$ in three sub-passes respectively.

Figure 10:
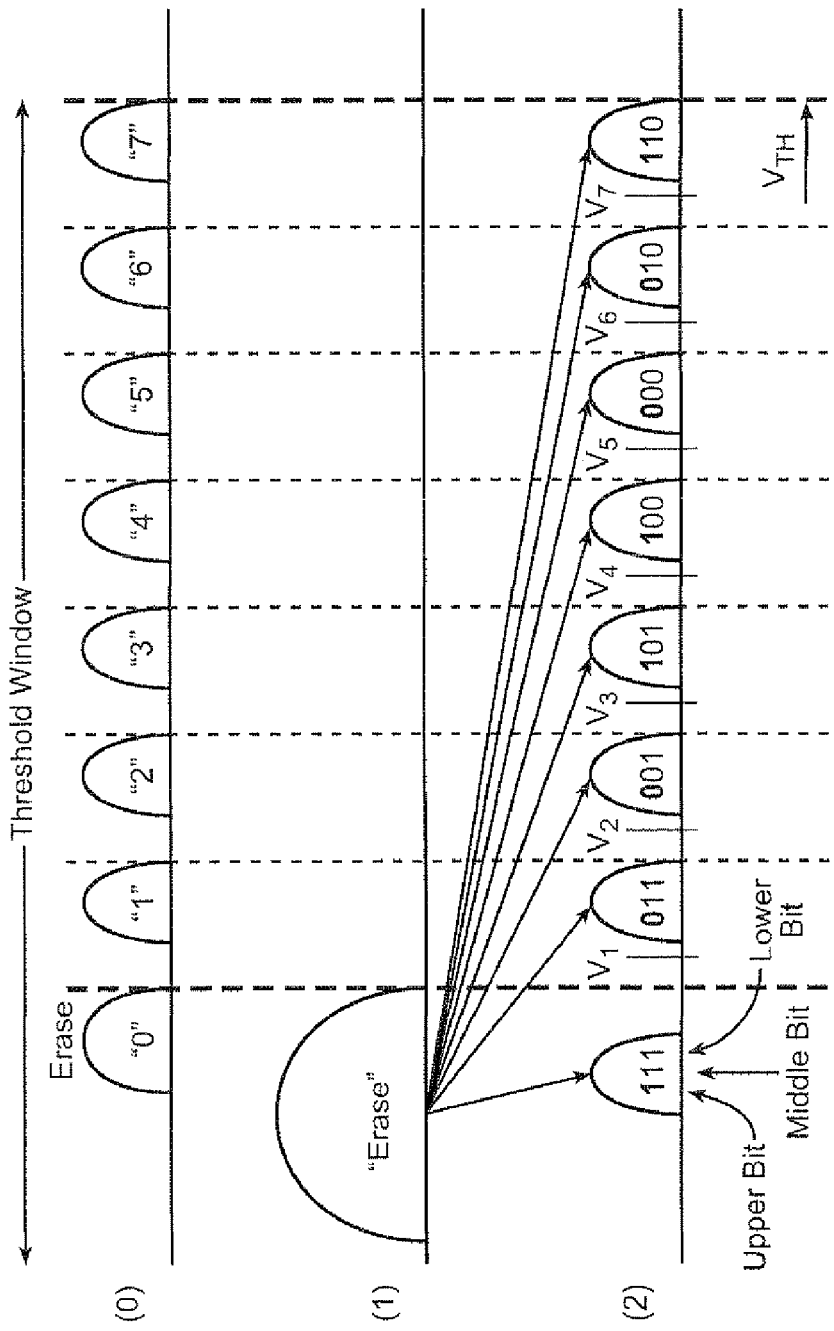
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $V_1$-$V_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101', "100", "000", "010" and '110". The 3-bit data may be read from the memory by sensing in "full-sequence" mode where the three bits are sensed together by sensing relative to the read demarcation threshold values $V_1$, -$V_7$ in seven sub-passes respectively.

Page or Word-line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Since a verifying take place after a programming pulse and each verifying may be relative to a number of verify levels, various "smart" verifying schemes have been implemented to reduce the total number of verifying operations. For example, since the pulse by pulse programming increasing programs the population of cells towards higher and higher threshold levels, verifying relative to a higher verify level needs not start until a certain pulse. An example of a programming technique with smart verify is disclosed in U.S. Pat. No. 7,243,275, "SMART VERIFY FOR MULTI-STATE MEMORIES" by Gongwer et al., issued 10 Jul. 2007, and assigned to the same assignee as the present application. The entire disclosure of U.S. Pat. No. 7,243,275 is incorporated herein by reference.

Figure 11:
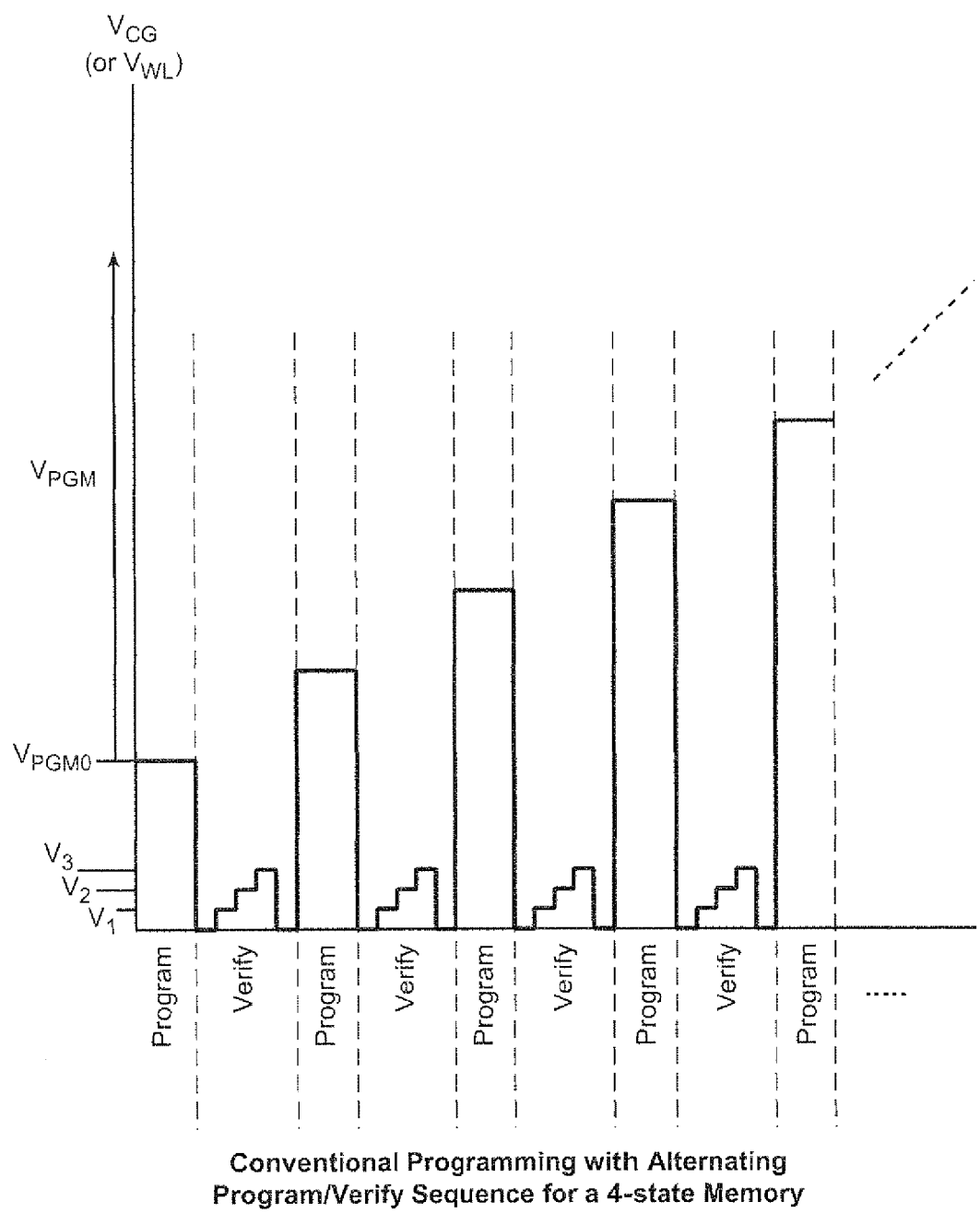
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

Fast Settling of Word Lines

As just discussed with respect to FIG. 11, a program operation s can be divided into two parts or alternating phases, the program pulse and subsequent verify. After a high voltage program pulse $V_{PGM}$, the verify operation follows to check if each of the cells pass by verifying as being programmed to their corresponding target states. The verify operation is basically a sensing operation to check the individual cells' threshold voltages, Vt, with the selected word line voltage being set to the various verify voltage levels, such as the three levels shown in. FIG. 11 for a 4-state embodiment. In a NAND type architecture, the other, non-selected word lines are charged up to a read pass voltage (Vread) to effectively remove their influence from the read process of the selected cells and allow the conduction current through NAND array. In a typical embodiment, this read pass voltage is taken to be higher than the standard read voltages used to differentiate the states of a selected cell. When the neighboring word lines are moved up to Vread, the selected word line voltage (Vcgrv) is coupled up due to the capacitive coupling because the word lines' closeness to each other. As the technology continues to shrink, word lines become closer, leading to more coupling. In order to perform an accurate verify operation, before the coupled-up word line can be sensed, its voltage should settle down to the desired target value. Due the increasing length in word line, density of cells along the word line, or both, word line resistance increases, increasing the settling time as technology shrinks, and/or with growing memory array size. In the prior art, this would be addressed by increasing the wait time allotted for settling before the first verify of the verify phase can be performed, which can become a significant portion of the program time.

This section addresses this problem of a large waiting time at the start of a verify phase of a write operation when the selected word line is moving to its first verify level (Vcgrv), while at the same time the non-selected word lines are ramping up to higher Vread level. The concept used here is to prepare the verify level of a selected word line settings earlier, and to minimize the voltage movement of neighboring word lines. This can significantly reduce the time necessary for word lines to settle down the selected word line Verify level.

Figure 12:
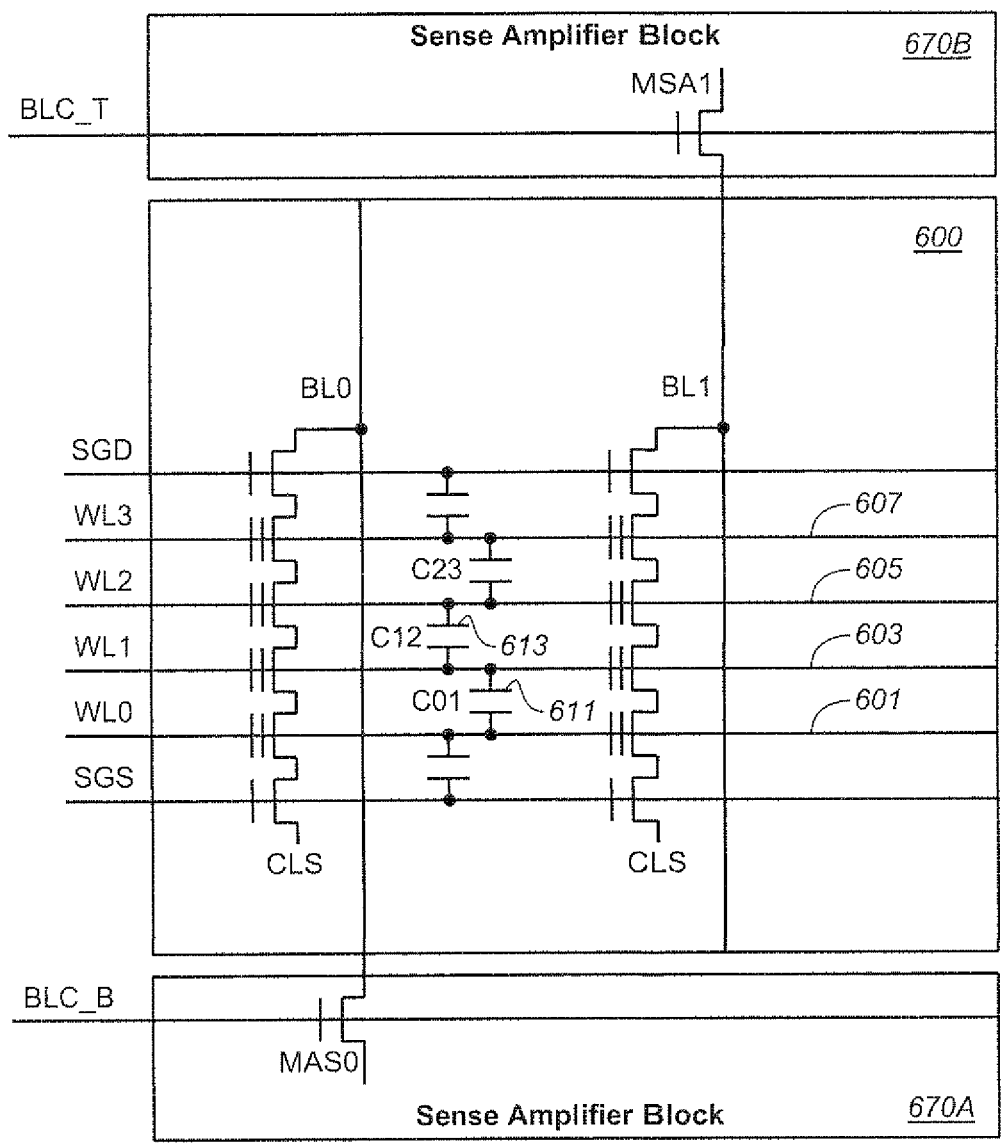
FIG. 12 is a simplified example of a small NAND array.

This problem can be further with respect to FIG. 12. FIG. 12 is an example of a small. NAND flash cell array 600 having only 4 word lines (WL0~3) and 2 bit lines (BL0~1) in one block for easy explanation. There are drain and source side select gates on the ends of the two NAND strings have their gates respectively attached along SGD, SGS to select one of many blocks in whole array. The drain side of the NAND strings are then attached to a bit by the drain side select gates and a common source line, at CLS, on the source side by the source side select gates. The bit lines BL0 and BL1 are respectively connected to sense amp block 670A by MSA0, controlled by the level at BLC_B, and to sense amp block 670B by MSA1, controlled by the level on BLC_T. If a block is selected for sensing operation, SGD and SGS voltages move up to turn on NAND strings in a block and connect them to their corresponding bit lines. Bit lines are then connected to the sense amplifier blocks to sense the cell current. This all can be much as described in the preceding sections, but with just some of the relevant elements for this discussion being presented here in simplified form.

The word lines will have high parasitic resistances and parasitic capacitances. There will also be parasitic capacitances between the first and last word lines (here WL0 and WL3) on the NAND strings the adjacent select gate control lines (SGS and SGD, respectively). These are illustrated on FIG. 12, where it should be noted that these are not added capacitors, but rather illustrate inherent word line to word line (or to select line) capacitances. Of these, the biggest parasitic capacitance resides between word lines (C01, C12, C23).

Figure 13:
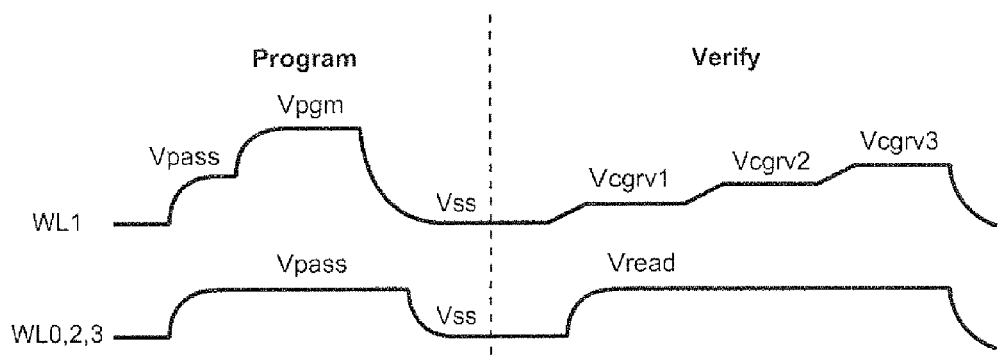
FIG. 13 shows an example of one pulse-verify cycle in a write operation.

This problems to which this capacitive coupling can lead can be further illustrates with respect to FIG. 13, that shows an overall waveform of one cycle of a write operation, having one program pulse and multiple Verify operations for the different data states. In FIG. 11, this corresponds to one of the pulses, the following interval where the word line is at ground the following the pulse, and the subsequent verify levels. In FIG. 13, WL1 603 is the selected word line for writing and is shown at top. Consequently WL1 is pulsed to Vpgm and is then supplied with the Vcgry values for the various states during the verify phase. When the selected word line is being pulsed, the other, non-selected word lines (WL0 601, WL2 605, WL3 607) are charged to programming pass voltage Vpass for channel boosting purposes. In the arrangement of FIG. 13, prior to the pulse at Vpgm, the selected WL1 is also taken to Vpass at the same time as the non-selected word lines. During the verify phase, the non-selected word lines (WL0,2,3) are set at a read pass voltage Vread for turning on non-selected cells of the NAND string, while the selected WL1 is biased to the sensing voltage level (Vcgrv) or levels, which can vary from a negative voltage (−3V) to a positive voltage (5V).

In the transition between the program and verify phase, both selected and non-selected word lines are taken to the device's low voltage level, Vss or ground, as shown at the broken vertical line. The word lines are then biased for the first level of the verify operation. Before cells along the selected word line can accurately be sensed, any transitory fluctuations in the voltage levels should subside. During the verify phase, the voltage difference between the selected word line (Vcgrv) and the neighboring, non-selected word lines (Vread) can be relatively large for lower Vcgrv values. Given the high word line resistance and high word line to word line coupling capacitance as technology shrinks, when a neighboring word lines moves up to Vread, the selected word line is also pulled up due to the coupling and it can take a relatively long time for the selected word line to settle down to its initial target level (Vcgrv1). This is shown in more detail in FIG. 15.

Figure 15:
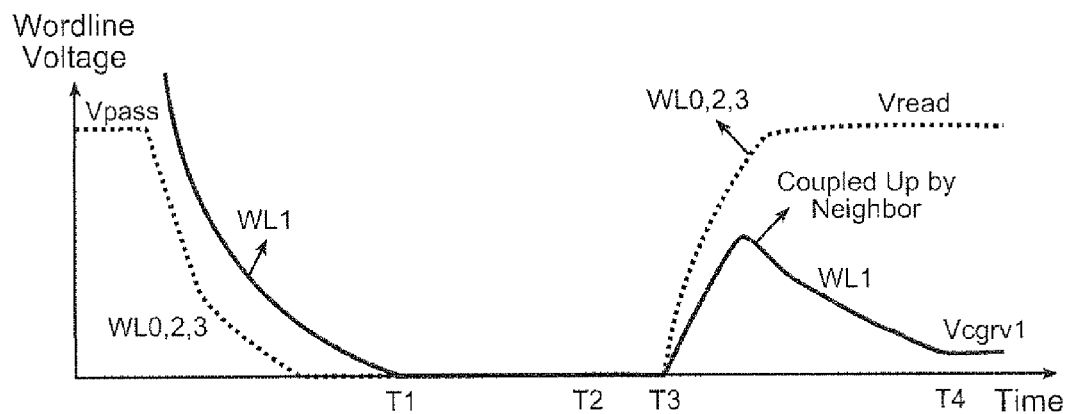
FIGS. 15 and 16 respectively show detail of FIGS. 13 and 14.

FIG. 15 shows the transition to the verify phase in FIG. 13 in more detail, and shows the time from the tail end of a pulse, ending at T1, until the establishment of the bias conditions for the first sensing operation of a verify at T4. The effects of the word line to word line coupling are shown in detail at time T3~T4. (T2 will enter into the discussion of FIG. 16 below.) This coupling level is a function of many factors, such as the Vread to Vcgrv difference, the Vread ramp time, word line resistance and capacitance, and so on. The coupled-up voltage in selected word line should get return to its target level as quickly as possible in order to expedite bit line voltage and current accordingly. Consequently, the time from T3 to T4 is wasted time. Although FIG. 15 is not fully to scale, it gives a general idea of the relative times involved and that this settling time can be a significant part of a pulse-verify cycle; and as a write operation will often have many pulse-verify cycles before all the cells on a word line verify (or a maximum number of iterations is reached), the cumulative time can have a fairly significant effect on write performance.

In a principle aspect of this section, embodiments presented here treat this problem by introducing some changes in the word line voltage waveforms. The underlying concept is to reduce the amount of voltage swing in the neighboring word lines of the a selected word line and, hence, reduce the amount of induced swing in the selected word line. The bias conditions for the first sensing operation of the verify phase can then be more quickly established.

Figure 14:
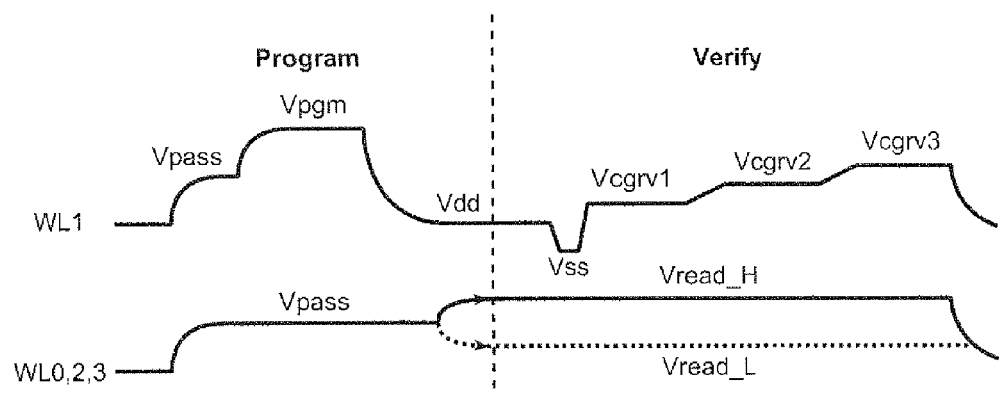
FIG. 14 illustrates a pulse-verify cycle using an embodiment of a fast word line settling technique.

FIG. 14 shows the overall voltage waveform of word lines according to an exemplary embodiment, which can be compared to FIG. 12. In FIG. 14, the selected word line WL1 again includes the optional raising to Vpass at the same time as the non-selected word lines (WL0,2,3) before being pulsed. Compared with FIG. 12, in the shown embodiment the selected word line (WL1) is initially discharged to the on-chip supply level Vdd at the end of program pulse, instead of going directly to Vss. (As discussed below, in other embodiments WL1 may be taken directly to Vss.) For the non-selected word lines (WL0,2,3), the voltages are shifted directly from Vpass to Vread at the same time. Consequently, the voltage level change in these non-selected word lines is smaller, thereby induced less change in WL0, and is done before establishing the initial verify level on WL1, so that any induced transient voltage raising on WL1 is around the time of the broken vertical line, rather than when Vcgrv1 is set. In FIG. 14, the values Vread_H and Vread_L are shown to represent the range of values for Vread relative to Vpass that may be used for the read pass voltage in different embodiments. Depending upon a number of factors, both Vpass and Vread can have a range of values depending upon the actual implementation. For example, a typical Vpass value of ~7V may be used with Vread in the range of 6V to 8.5V, where the lines for Vread_H and Vread_L represent the range, not separate values used for different purposes. In either case, the change ΔV between Vpass and Vread is quite a bit small than from Vss to Vread.

Figure 16:
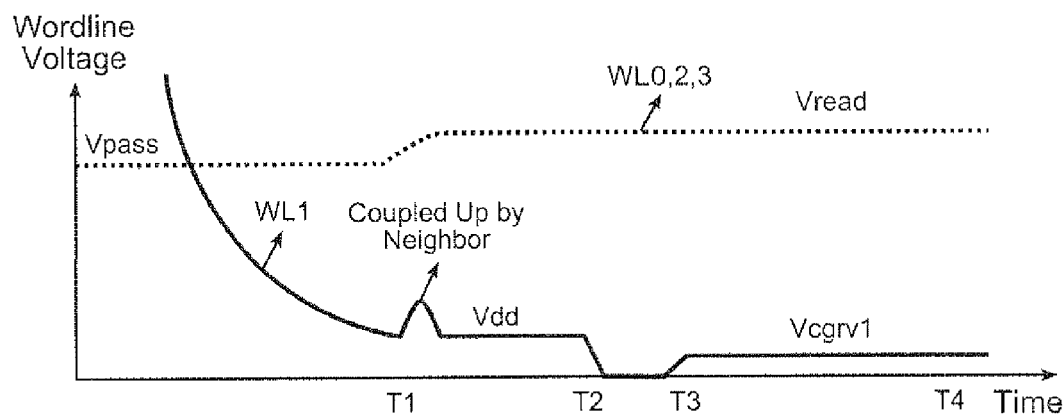

FIG. 16 shows more detailed waveforms and corresponds to FIG. 14 in the same way that FIG. 15 relates to FIG. 13. At the end of program phase at T1, the non-selected word line voltages are changed from Vpass to Vread directly, rather than being taken ground in between. As noted, although the Vpass and Vread voltages do not necessarily match, their voltage difference is much smaller than whole Vread swing, hence causing less coupling-up voltage to selected word line. Also, the changing time is at the end of program pulse, hence there is much more time to settle down with much less coupling voltage level. Because of this, the initial verify sense level of Vcgrv1 for WL1 can be quickly established from T3, rather than having to wait until T4, as shown in the arrangement of FIG. 15. Consequently, the equivalent of the time from T3 to 14 can be saved in each pulse-verify cycle of a write operation.

In FIG. 16, after the programming pulse the selected word line WL1 is first taken to Vdd (at T1), then to Vss at T2, before being set to a verify level at T3. This is one of several options for the waveform of a selected word line in the transition from the pulse bias conditions to the verify bias conditions. When the neighboring, non-selected word lines are changed to Vread while the selected word line is discharged to a lower level during the T1~T2 period, this may give extra stress to the NAND string. By applying a voltage higher than ground or Vss during this period, such as Vdd (typically ~2V) or even some higher level, the voltage differences between WL1 and WL0,2 are much relieved, which may help reduce any resultant side effects. Since WL1 is charged to Vdd, it will need to eventual change to Vcgrv for the verify phase. Rather than transitioning from Vdd to Vcrv directly, is usually more practical to discharge Vdd to Vss first, and with the Vss to Vcgrv afterwards. There are a number of optional sequences possible for WL1 to follow between T1 and T3, including using one of the pass voltages on WL1 as well, setting it directly to Vcgrv1, or to other levels above ground; however, using these "analog" (in that they are neither Vdd nor Vss) are generally not preferred as they usually take quite a bit more time to establish when compared to the high (Vdd) and low (Vss or ground) supply values on the device, Because of this, Vss or Vdd is commonly used for discharging the higher pumped voltages, such as Vpgm. Consequently, at time T1 it is preferred to set WL1 at either Vss or Vdd, since discharging to, say, Vread or Vpass can take a longer time due to their poor discharging capability. Going directly to Vss at T1 is the simplest solution, but if stress on the NAND strings is a concern, the shown process of initial taking WL1 to Vdd (for the Vpass to Vread transition on the non-selected word lines), then relax WL1 to Vss (to more easily set the first verify voltage) can be a good choice. For any of these variations, techniques of this can improve the settling times involved in the write operation.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of writing one or more memory cells along a selected word line of a non-volatile memory having an NAND-type architecture, the method comprising a series of one or more pulse-verify cycles, a pulse-verify cycle including:
   applying a programming pass voltage greater than ground to non-selected word lines of a NAND string to which the selected word line belongs;
   while applying the programming pass voltage to non-selected word lines, applying a programming pulse to the selected word line;
   subsequent to applying the programming pulse, applying a read pass voltage greater than ground to the non-selected word lines, wherein the voltage applied to the non-selected word lines is changed directly from the programming pass voltage to the read pass voltage without being set to ground therebetween; and
   subsequently setting the selected word line to a first verify voltage greater than ground while applying the read pass voltage to the non-selected word lines.

2. The method of claim 1, further comprising:
   subsequent to applying the programming pulse and prior to setting the selected word line to the first verify voltage, setting the selected word line to ground.

3. The method of claim 2, the pulse-verify cycle further including:
   subsequent to applying the programming pulse and setting the selected word line to ground, setting the selected word line to a voltage above ground while the non-selected word lines is changed from the programming pass voltage to the read pass voltage.

4. The method of claim 1, wherein the read pass voltage is greater than the programming pass voltage.

5. The method of claim 1, wherein the read pass voltage is less than the programming pass voltage.

6. The method of claim 1, the pulse-verify cycle further including:
   prior to applying the programming pulse, applying the programming pass voltage to the selected word line concurrently with applying the programming pass voltage to the non-selected word lines.

7. The method of claim 1, the method including a sequence of a plurality of pulse-verify cycles, wherein the voltage of the programming pulse increases with each pulse-verify cycle in the sequence.

8. A method of writing one or more memory cells along a selected word line of a non-volatile memory having an NAND-type architecture, the method comprising a series of one or more pulse-verify cycles, a pulse-verify cycle including:
   applying a programming pass voltage greater than ground to non-selected word lines of a NAND string to which the selected word line belongs;
   while applying the programming pass voltage to non-selected word lines, applying a programming pulse to the selected word line;
   subsequent to applying the programming pulse, applying a read pass voltage greater than ground to the non-selected word lines, wherein the voltage applied to the non-selected word lines is changed directly from the programming pass voltage to the read pass voltage without being set to ground therebetween;
   subsequently setting the selected word line to a first verify voltage greater than ground while applying the read pass voltage to the non-selected word lines; and
   subsequent to setting the selected word line to the first verify voltage and while applying the read pass voltage to the non-selected word lines, setting the selected word line to a second verify voltage greater than first verify voltage.

9. A method of writing one or more memory cells along a selected word line of a non-volatile memory having an NAND-type architecture, the method comprising a series of one or more pulse-verify cycles, a pulse-verify cycle including:
   applying a programming pass voltage greater than ground to non-selected word lines of a NAND string to which the selected word line belongs;
   while applying the programming pass voltage to non-selected word lines, applying a programming pulse to the selected word line;
   subsequent to applying the programming pulse, applying a read pass voltage greater than ground to the non-selected word lines, wherein the voltage applied to the non-selected word lines is changed directly from the programming pass voltage to the read pass voltage without being set to ground therebetween; and subsequently setting the selected word line to a first verify voltage greater than ground while applying the read pass voltage to the non-selected word lines, the method including a sequence of a plurality of pulse-verify cycles, wherein the voltage of the programming pulse increases with each pulse-verify cycle in the sequence. and wherein a pulse-verify cycle further includes, subsequent to setting the selected word line to the first verify voltage, individually determining whether memory cells along the selected word line verify as successfully programmed, and subsequently locking out from further programming memory cells that verify as successfully programmed.

* * * * *